(12) United States Patent
Kim et al.

(10) Patent No.: US 9,640,665 B2
(45) Date of Patent: May 2, 2017

(54) FIN FET AND METHOD OF FABRICATING SAME

(71) Applicant: Samsung Electronics Co., Ltd., Suwon-si (KR)

(72) Inventors: Keun-Nam Kim, Seoul (KR); Hung-Mo Yang, Suwon-si (KR); Choong-Ho Lee, Sungnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/931,490

(22) Filed: Nov. 3, 2015

(65) Prior Publication Data

US 2016/0056296 A1    Feb. 25, 2016

Related U.S. Application Data

(60) Continuation of application No. 14/695,672, filed on Apr. 24, 2015, now Pat. No. 9,196,733, which is a
(Continued)

(30) Foreign Application Priority Data

Feb. 5, 2004    (KR) ........................ 10-2004-0007426

(51) Int. Cl.
*H01L 27/088*    (2006.01)
*H01L 29/78*    (2006.01)
(Continued)

(52) U.S. Cl.
CPC ...... *H01L 29/7856* (2013.01); *H01L 29/0657* (2013.01); *H01L 29/4236* (2013.01); *H01L 29/66621* (2013.01); *H01L 29/66795* (2013.01); *H01L 29/7851* (2013.01); *H01L 29/7854* (2013.01)

(58) Field of Classification Search
None
See application file for complete search history.

(56) References Cited

U.S. PATENT DOCUMENTS 5,675,164 A    10/1997    Brunner et al.
5,844,278 A    12/1998    Mizuno et al.
(Continued)

FOREIGN PATENT DOCUMENTS

KR    10-2003-0065631 A    8/2003

*Primary Examiner* — Jack Chen
(74) *Attorney, Agent, or Firm* — Muir Patent Law, PLLC (57) ABSTRACT

A fin field effect transistor (fin FET) is formed using a bulk silicon substrate and sufficiently guarantees a top channel length formed under a gate, by forming a recess having a predetermined depth in a fin active region and then by forming the gate in an upper part of the recess. A device isolation film is formed to define a non-active region and a fin active region in a predetermined region of the substrate. In a portion of the device isolation film a first recess is formed, and in a portion of the fin active region a second recess having a depth shallower than the first recess is formed. A gate insulation layer is formed within the second recess, and a gate is formed in an upper part of the second recess. A source/drain region is formed in the fin active region of both sides of a gate electrode.

10 Claims, 11 Drawing Sheets

Related U.S. Application Data continuation of application No. 13/429,969, filed on Mar. 26, 2012, now Pat. No. 9,018,697, which is a continuation of application No. 13/178,308, filed on Jul. 7, 2011, now Pat. No. 8,264,034, which is a division of application No. 12/622,798, filed on Nov. 20, 2009, now Pat. No. 8,053,833, which is a continuation of application No. 11/733,704, filed on Apr. 10, 2007, now Pat. No. 7,868,380, which is a division of application No. 11/050,915, filed on Feb. 4, 2005, now Pat. No. 7,217,623.

(51) Int. Cl.
*H01L 29/66* (2006.01)
*H01L 29/06* (2006.01)
*H01L 29/423* (2006.01)

(56) References Cited

U.S. PATENT DOCUMENTS

| | | |
|---|---|---|
| 6,242,783 B1 | 6/2001 | Ohmi et al. |
| 6,413,862 B1 | 7/2002 | Farnworth et al. |
| 6,525,403 B2 | 2/2003 | Inaba et al. |
| 6,562,665 B1 | 5/2003 | Yu |
| 7,317,230 B2 | 1/2008 | Lee et al. |
| 7,394,116 B2 | 7/2008 | Kim et al. |
| 7,459,358 B2 | 12/2008 | Lee et al. |
| 7,563,699 B2 | 7/2009 | Yeom |
| 7,804,129 B2 | 9/2010 | Kim et al. |
| 7,923,784 B2 | 4/2011 | Chae et al. |
| 2005/0133836 A1* | 6/2005 | Seo ............... H01L 29/4236 257/288 |
| 2006/0105529 A1 | 5/2006 | Lee |
| 2006/0231907 A1 | 10/2006 | Kim et al. |

\* cited by examiner

FIN FET AND METHOD OF FABRICATING SAME

CROSS REFERENCE TO RELATED APPLICATIONS

This application is a Continuation Application of U.S. patent application Ser. No. 14/695,672 filed on Apr. 24, 2015, which is a Continuation Application of U.S. patent application Ser. No. 13/429,969 filed on Mar. 26, 2012 now U.S. Pat. No. 9,018,697 which is a Continuation application of U.S. patent application Ser. No. 13/178,308, filed on Jul. 7, 2011, which is a Divisional application of U.S. patent application Ser. No. 12/622,798 filed on Nov. 20, 2009, now U.S. Pat. No. 8,053,833, issued Nov. 8, 2011, which is a Continuation application of continuation of copending U.S. patent application Ser. No. 11/733,704 filed Apr. 10, 2007, now U.S. Pat. No. 7,868,380, issued Jan. 11, 2011, which is a division Divisional application of U.S. patent application Ser. No. 11/050,915, filed on Feb. 4, 2005, now U.S. Pat. No. 7,217,623, issued May 15, 2007, which claims priority from Korean Patent Application No. 10-2004-0007426, filed on Feb. 5, 2004, the disclosures of which are incorporated herein in their entirety by reference.

BACKGROUND OF THE INVENTION

1. Field of the Invention

This disclosure relates to a semiconductor memory device, and more particularly, to a fin field effect transistor where a fin type active region is formed.

2. Description of the Related Art

Recently continuous requirements for semiconductor memory devices having lower power consumption, higher efficiency, and improved speed operation characteristics have brought about a continuously reduced design rule for the purposes of integrating more semiconductor memory devices within a semiconductor chip of a limited size. However, as semiconductor memory devices become increasingly integrated, the channel length of individual devices is gradually reduced. This causes a short channel effect, increases the channel doping density of transistors constituting a memory cell, and also increases the junction leakage current.

To solve these problems, fin field effect transistors (fin FETs) that have a fin-type active region are formed on an SOI (Silicon On Insulator) silicon substrate and then a gate electrode is formed on the fin region. An example of such a device is disclosed in U.S. Pat. No. 6,525,403 entitled "Semiconductor device having MIS field effect transistors or three-dimensional structure".

Such a fin FET can effectively control a leakage current generated in a channel and can ensure a channel length, preventing or substantially reducing a short channel effect and improving swing characteristics of the transistor and decreasing a leakage current. However, there are still some disadvantages that exist when the fin FET is formed on the SOI silicon substrate because the price of SOI wafers is higher than bulk wafers and the parasitic source/drain resistance increases. Furthermore, a channel formation body of the semiconductor device is not connected to the SOI substrate according to a characteristic of the SOI device, thus a floating body effect is present, and heat generated in the device that is typically conducted to the SOI silicon substrate is cut off by an oxide layer formed on the SOI silicon substrate, thus degrading the performance of the semiconductor device.

Embodiments of the invention address these and other disadvantages of the conventional art.

SUMMARY OF THE INVENTION

Exemplary embodiments of the invention provide a method of forming a fin field effect transistor (fin FET) by using a bulk silicon substrate, and a structure thereof. The fin FET is formed by forming a recess having a predetermined depth in a fin active region through use of the bulk silicon substrate, and then by forming a gate on an upper part of the recess, thereby guaranteeing a length of top channel formed under the gate. Also, lengths of top channel and bottom channel are uniformly formed in the fin active region by increasing a length of the top channel, thus improving swing characteristics of the fin FET. The top channel is formed lower than a source/drain region, thus improving a drain induced barrier lowering (DIBL) and reducing an electric field of channel and source/drain. The increase of top channel length can also reduce an impurity ion implantation amount of a threshold voltage control region formed under a gate, reducing a junction leakage current of the fin FET and improving refresh characteristics. In forming the recess having a predetermined depth in the fin active region there is no need to use a specific etch stop layer, thus simplifying a fabrication process of the fin FET. An upper edge portion of the fin active region is rounded, thereby preventing an electric field concentration onto an edge portion and a punch-through in the channel, and uniformly forming a gate insulation layer on an upper part of the fin active region.

BRIEF DESCRIPTION OF THE DRAWINGS

The above and other features of exemplary embodiments of the invention will become readily apparent from the description that follows, with reference to the attached drawings.

FIGS. 2a to 10a are sectional diagrams illustrating exemplary sequential processes for forming the fin FET of FIG. 1, taken along the line I-I' of FIG. 1.

FIGS. 2b to 10b, and FIG. 11, are sectional diagrams illustrating exemplary sequential processes for forming the fin FET of FIG. 1, taken along the line II-II' of FIG. 1.

DETAILED DESCRIPTION OF THE INVENTION

Exemplary embodiments of the invention are more fully described in detail with reference to the accompanied drawings. The invention may be embodied in many different forms and should not be construed as being limited to the exemplary embodiments set forth herein. Rather, these exemplary embodiments are provided so that this disclosure is thorough and complete, and to convey the concepts of the invention to those skilled in the art.

Figure 1:
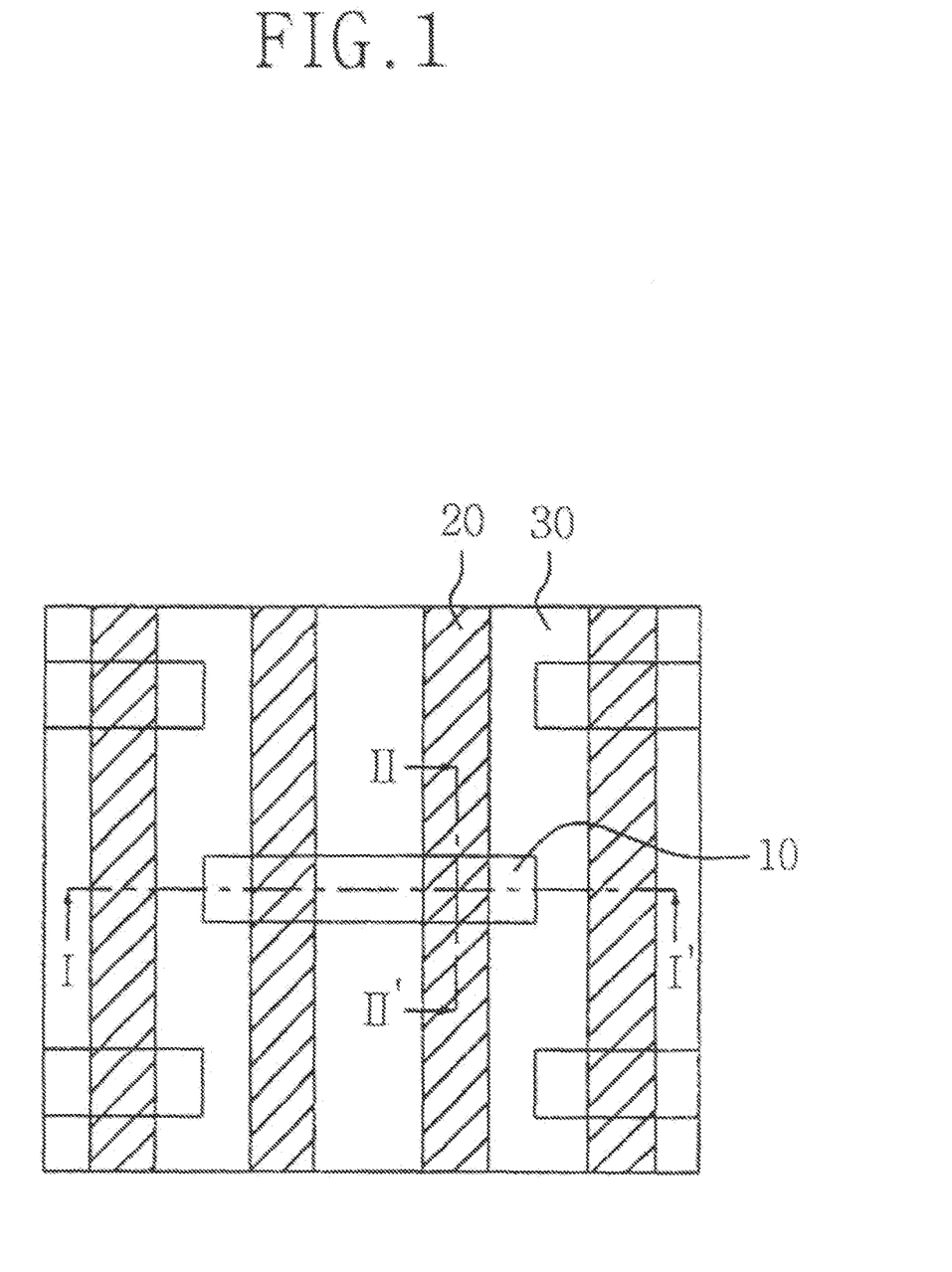
FIG. 1 is a layout diagram of a fin FET according to some embodiments of the invention.

FIG. 1 is a layout diagram illustrating a fin FET according to some embodiments of the invention.

Referring to FIG. 1, gate electrodes 20 are patterned and disposed in parallel with one another along lines that extend in a first direction, for example, the line Fin active regions 10 are disposed along parallel lines that extend in a second direction, for example, the line I-I'. The second direction is substantially perpendicular to the first direction. The fin active regions 10 are not continuous along the parallel lines that extend in the second direction, but rather the fin active regions 10 are surrounded by a non-active region 30. The fin active regions 10 protrude in a fin shape with step coverage with the non-active region 30.

With respect to one another, the fin active regions 10 are disposed in a diagonal configuration. That is, a line passing through the centers of a fin active region 10 and its closest neighboring fin active region 10 is neither parallel nor perpendicular to the first direction and the second direction, but rather has some angular offset with respect to the first and second directions. Adjacent fin active regions 10 are disposed uniformly, that is, a fin active region 10 and its nearest adjacent neighbors are separated by the same distance. The gate electrodes 20 are disposed substantially perpendicular to a length direction of the fin active region 10. Two gate electrodes 20 cross over every fin active region 10.

FIGS. 2a to 10a are sectional diagrams illustrating exemplary sequential processes for forming the fin FET of FIG. 1, taken along the line I-I' of FIG. 1.

FIGS. 2b to 10b and FIG. 11 are sectional diagrams illustrating exemplary sequential processes for forming the fin FET of FIG. 1, taken along the line II-IF of FIG. 1.

Figure 2A:
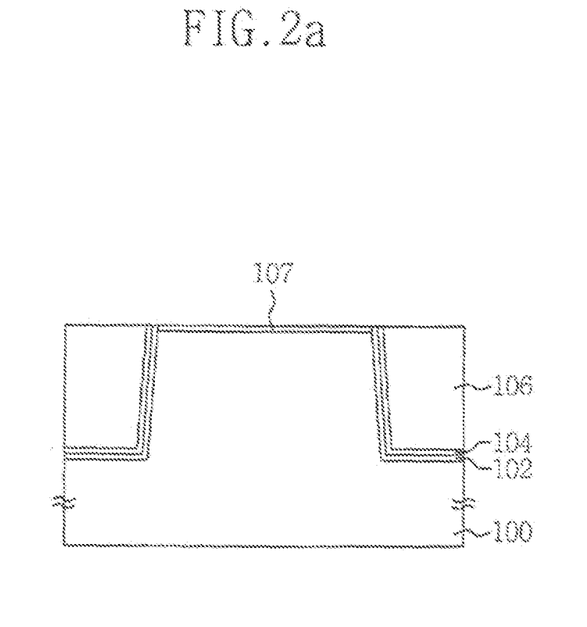
Figure 2B:
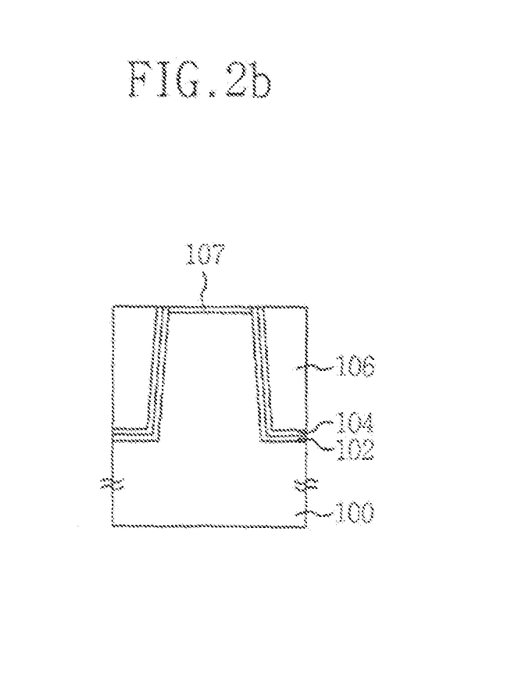

Referring first to FIGS. 2a and 2b, a device isolation film 106 for defining a non-active region and a fin active region is formed in a p-type bulk silicon substrate 100. The device isolation film 106 is obtained by a device isolation method (e.g., a Shallow Trench Isolation, or STI) where a trench having a predetermined depth is formed in the non-active region of the substrate, a first oxide layer 102 and a nitride layer 104 are sequentially accumulated on a bottom and a sidewall of the trench, and then an insulation layer is deposited in the trench to form the device isolation film 106. Subsequently, a second oxide layer 107 having a thickness of about 60 Å to 80 Å is formed on the substrate 100. The device isolation film 106 may be formed to a depth of about 2500 Å to 3000 Å, and may be formed of any one oxide layer chosen from the group consisting of SOG (Spin-On Glass), USG (Undoped Silicate Glass), BPSG (Boro-Phospo-Silicate Glass), PSG (Phospho-Silicate Glass), PE-TEOS (Plasma Enhanced—TetraEthyl OrthoSilicate), and liquid oxide layer material. Alternatively, the device isolation film 106 may be formed of a multi-layer involving two or more of the oxide layer group defined above.

Figure 3A:
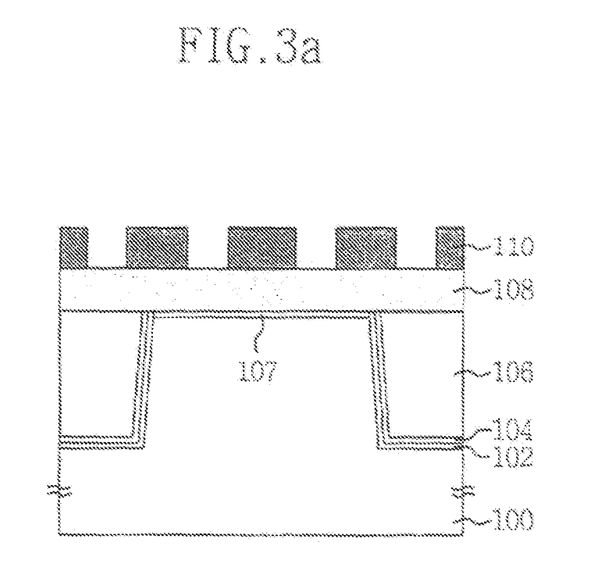
Figure 3B:
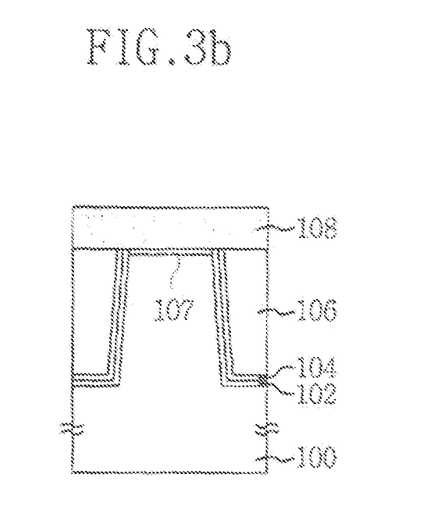

Referring to FIGS. 3a and 3b, an anti-reflective coating (ARC) layer 108 and a photoresist layer are sequentially formed, and then a photoresist pattern 110 is formed to expose a gate formation part through a photolithography process. The ARC layer 108 may be generally formed to enhance a resolution of the photolithography process, before depositing the photoresist layer.

Figure 4A:
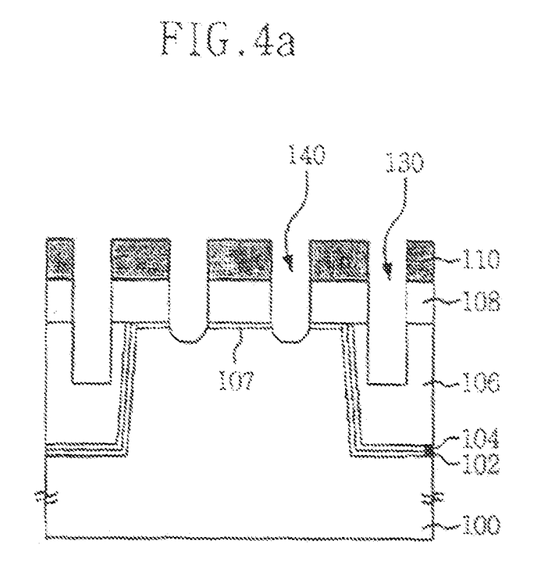
Figure 4B:
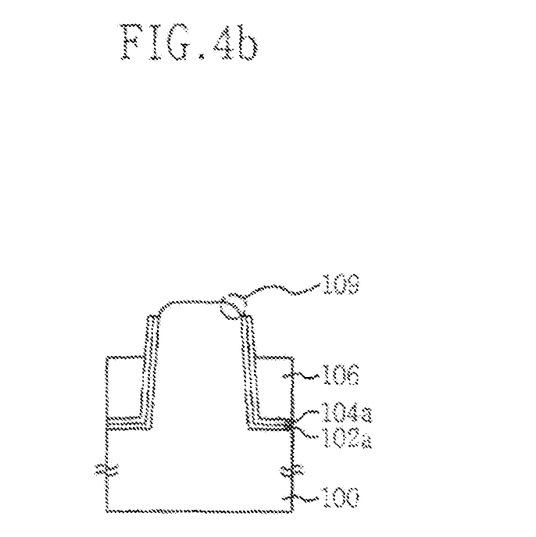

With reference to FIGS. 4a and 4b, the ARC layer 108, the second oxide layer 107, the device isolation film 106, and the substrate 100 are sequentially etched by using the photoresist pattern 110 as an etch mask, thus forming a first recess 130 having a predetermined depth from an upper surface of the substrate to a portion of the device isolation film 106, and also forming a second recess 140 having a depth from the upper surface of the substrate to a portion of the fin active region that is shallower than the first recess. The first recess 130 may be formed to a depth of about 1000 Å to 1500 Å, considering a height of the fin active region. The second recess 140 may be formed to a depth of about 300 Å to 350 Å to ensure a sufficient length of a top channel that is formed under a gate electrode, and may be formed by a dual recess type having two recesses in the active region surrounded by the non-active region. Also, since only the ARC layer 108 and the second oxide layer 107 are formed on the substrate, an upper edge portion 109 of the fin active region is rounded when etching of the oxide layer 107 and the substrate 100 occurs. The rounded upper edge portion 109 prevents an electric field concentration on the edge portion, prevents channel punch-through, and uniformly forms a gate insulation layer on the fin active region.

Figure 5A:
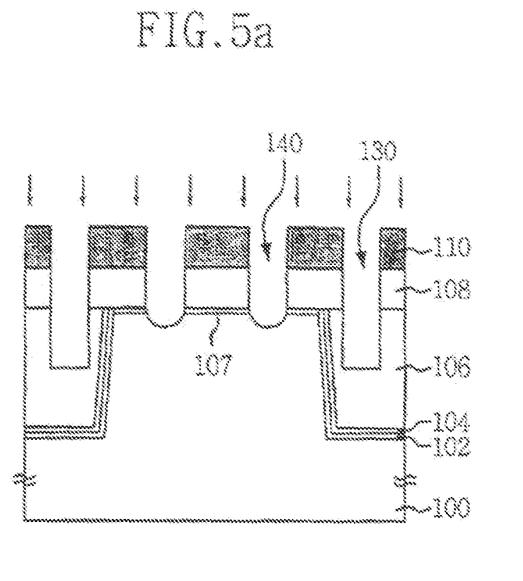
Figure 5B:
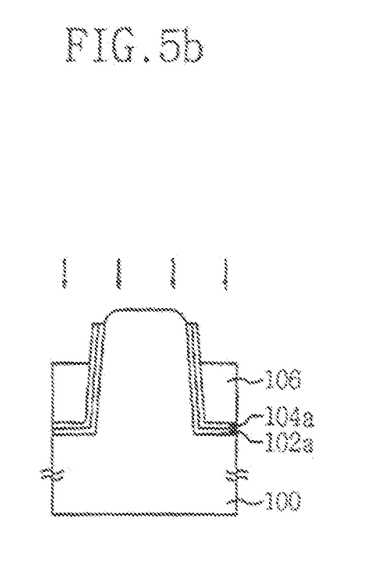

With reference to FIGS. 5a and 5b, p-type impurities are ion implanted by using the photoresist and an anti-reflective coating layer pattern as an ion implantation mask, to thus form a threshold voltage control region. For example, B or $BF_2$ ions may be implanted in the fin active region with an energy of about 30 KeV to 50 KeV and having a density of about $1.0 \times 10^{12}$ to $1.0 \times 10^{13}$ ion atoms/cm$^2$, thus resulting in a formation of the threshold voltage control region having a density of about $1.0 \times 10^{13}$ ion atoms/cm$^3$. The threshold voltage control region is formed in a lower part of the second recess, which guarantees a sufficient length for the top channel. Thus, the amount of ion impurities to be implanted may be reduced.

Figure 6A:
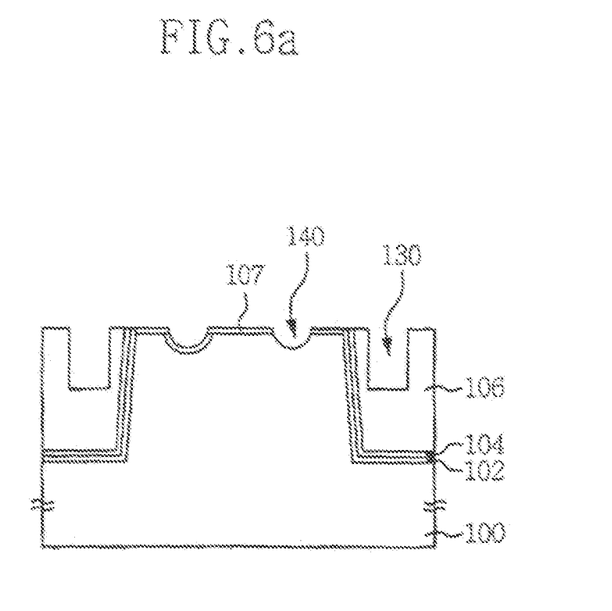
Figure 6B:
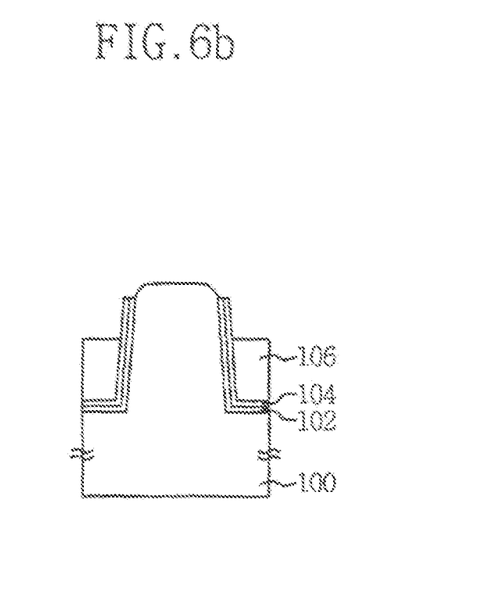

Referring to FIGS. 6a and 6b, the photoresist pattern 110 and the ARC layer 108 are removed by, e.g., an ashing or strip process. This leaves a portion of the nitride layer 104a and a portion of the first oxide layer 102a exposed on a sidewall of the fin active region, as shown in FIG. 6b.

Figure 7A:
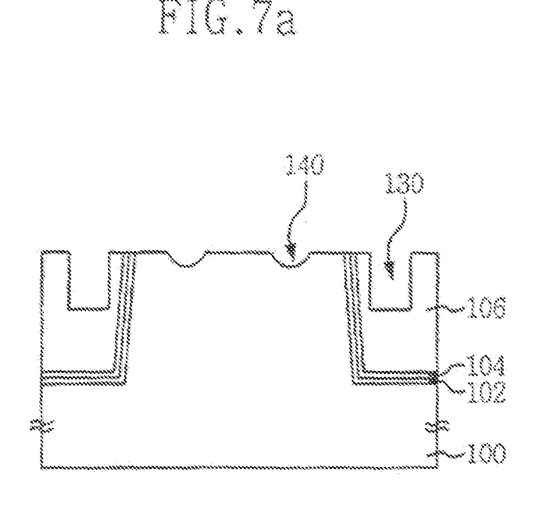
Figure 7B:
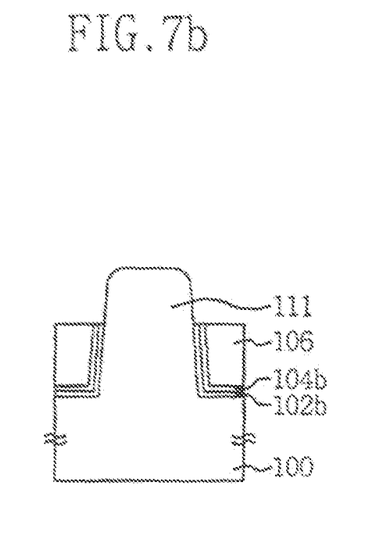

With reference to FIGS. 7a and 7b, the portion of the nitride layer 104a that is exposed on a sidewall of the fin active region is removed, then the portion of the first oxide layer 102a that is exposed on the sidewall of the fin active region is removed along with the second oxide layer 107. The nitride layer 104a may be removed by a wet etching using $H_3PO_4$, and the first and second oxide layers 102a and 107 may be removed by a wet etching using HF. As a result, as shown in FIG. 7b, a fin active region 111 has step coverage and protrudes with a predetermined height from the surrounding device isolation film 106.

Figure 8A:
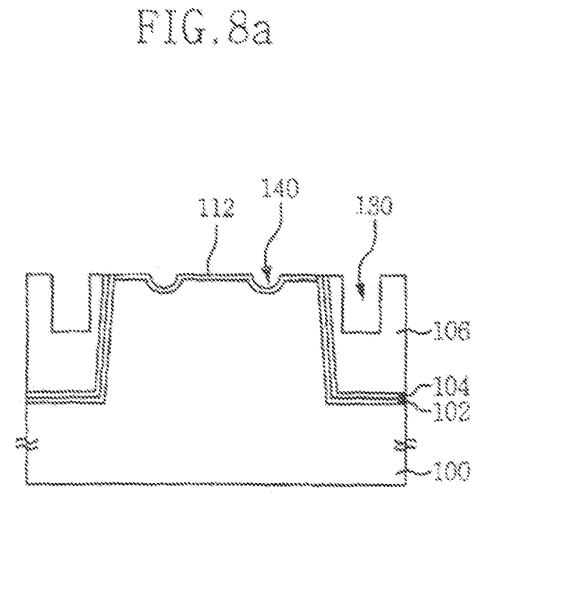
Figure 8B:
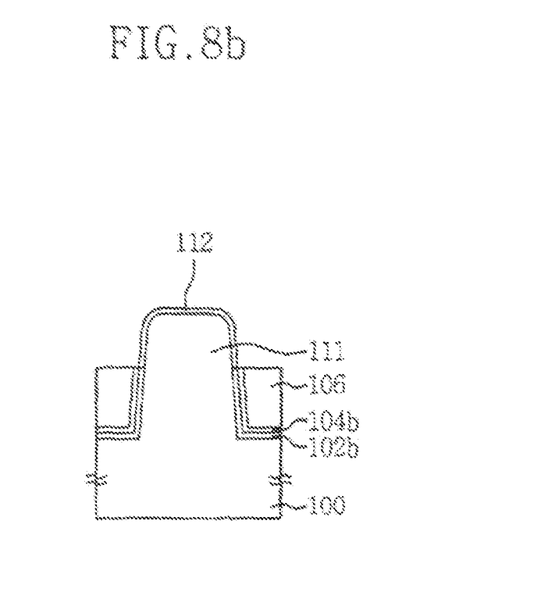

In FIGS. 8a and 8b, a gate insulation layer 112 is formed within the second recess 140. The gate insulation layer 112 is formed of oxide layer material, and may be formed by thermally oxidizing a bottom face of the recess 140 or by a deposition method such as a chemical vapor deposition (CVD) or a sputtering etc.

Figure 9A:
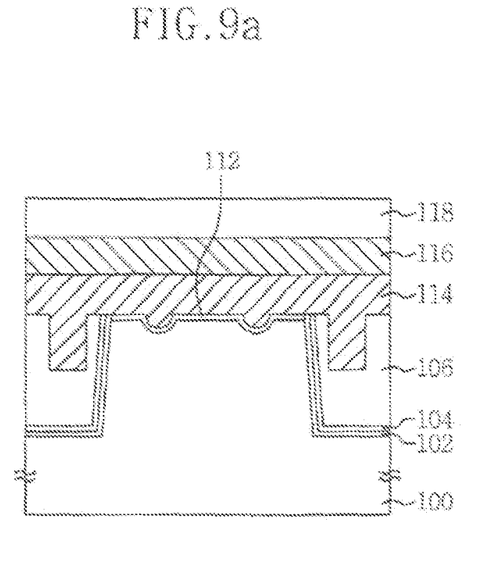
Figure 9B:
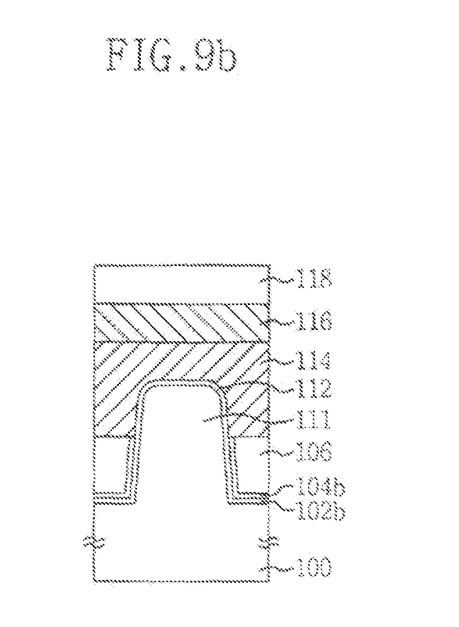

Referring to FIGS. 9a and 9b, a first gate conductive layer 114, a second gate conductive layer 116, and a capping layer 118, each of which have a predetermined thickness, are sequentially formed on the substrate. The first gate conductive layer 114 may be formed by a general deposition method such as CVD, low pressure chemical vapor deposition (LPCVD), or plasma enhanced chemical vapor deposition (PECVD), and may be formed of polysilicon material. The second gate conductive layer 116 may be formed by a general deposition method, or it may be formed of a metal such as tungsten (W) or of a silicide layer having a metal such as Ti, Ta, W, Ni, Cr, Ir or Ru. The first and second conductive layers 114 and 116 constitute a gate electrode, and may be formed of a single layer of polysilicon material. The capping layer 118 may be formed of silicon nitride layer material through a process such as, e.g., CVD, LPCVD, PECVD, a semi-atmospheric chemical vapor deposition (SACVD), a sputtering method, or an atomic layer deposition.

Figure 10A:
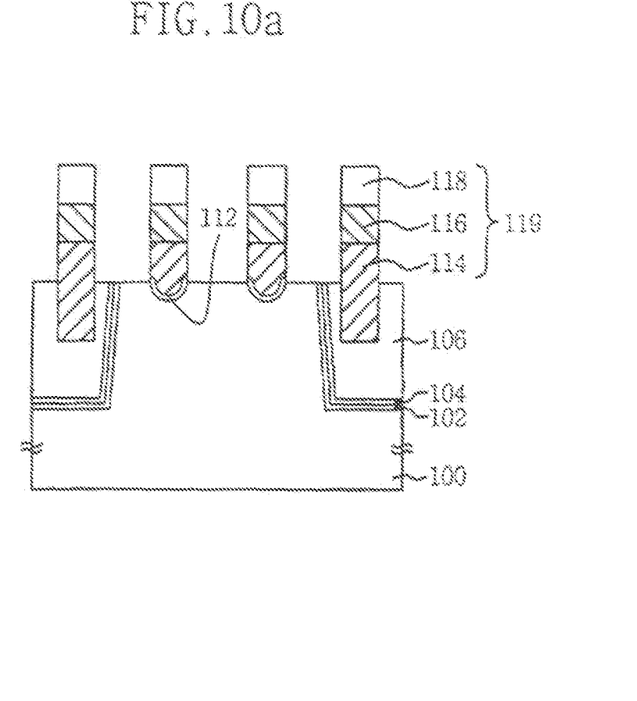
Figure 10B:
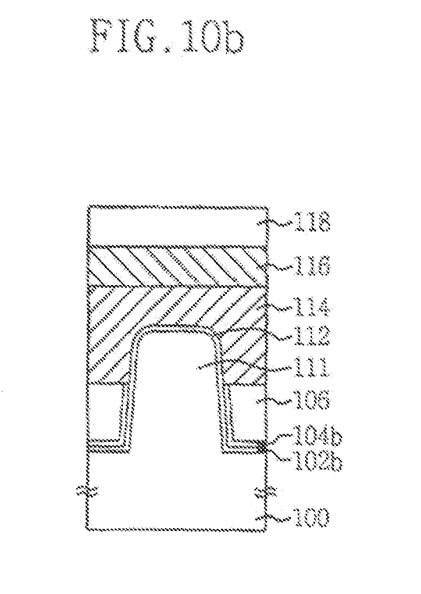

As shown in FIGS. 10a and 10b, a photolithography and etching process is performed, to thus form a gate stack 119 that has a gate conductive layer 114 that extends to an upper surface of the fin active region 111 and has a capping layer 118 on the gate conductive layer, within the second recess.

Figure 11:
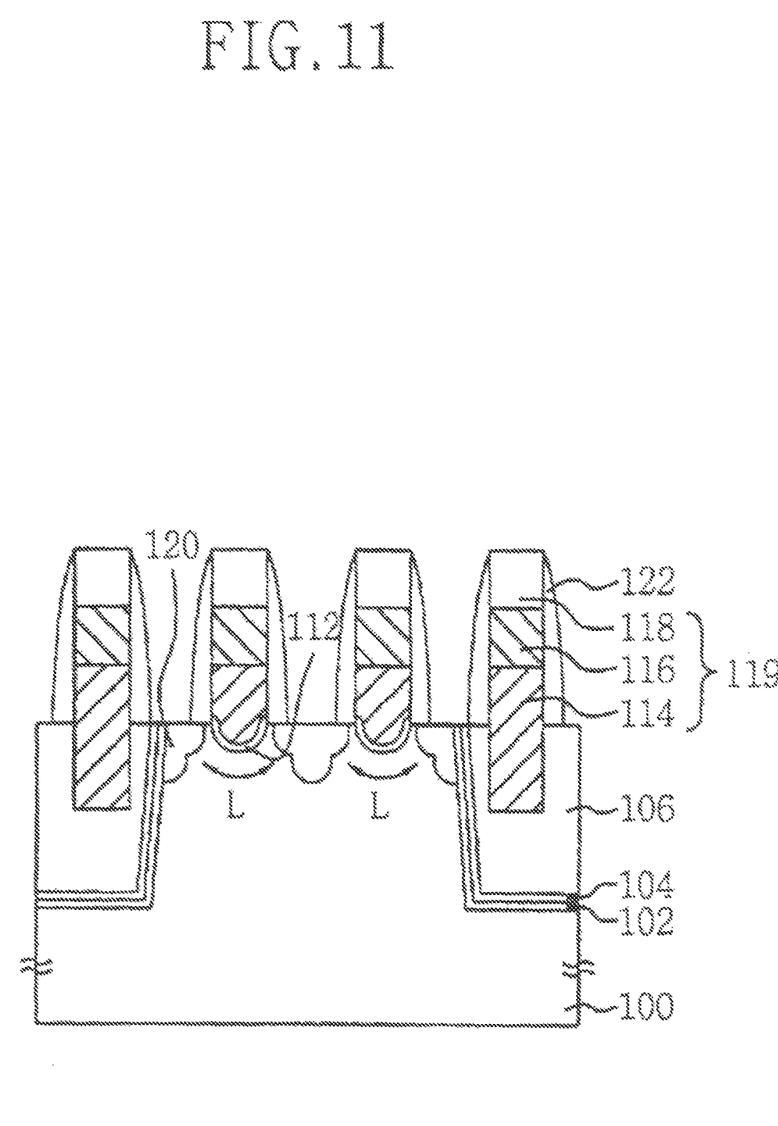

Referring to FIG. 11, after forming a gate spacer 122 in a sidewall of the gate stack 119, n-type impurities such as P (phosphorous) or As (Arsenic), etc., is ion implanted at an energy of about 10 KeV to 20 KeV and to a density of about $1.0 \times 10^{15}$ to $3.0 \times 10^{15}$ ion atoms/cm², by using the gate spacer 122 as an ion implantation mask, to thus form an n+ type source/drain region 120 of a high density in the fin active region of both sides of the gate electrode. Also, before forming the gate spacer 122, n type impurities are ion-implanted at a relatively low energy and to a relatively low density compared to the source/drain regions 120, thus forming a low density n-type source/drain region. Next, a n+ type source/drain region having a density higher than the low density n-type source/drain region is formed on a portion of the low density n-type source/drain region. Thus, a source/drain region having a LDD (Lightly Doped Drain) structure is obtained.

Accordingly, according to an exemplary embodiments of the invention, the method of forming a fin FET provides a fin field effect transistor (fin FET), including the device isolation film 106 defining a fin active region and a non-active region on a bulk silicon substrate; the fin active region 111 having a protrusion shape with step coverage of a predetermined height with the device isolation film; the gate electrodes 114 and 116, which have a predetermined depth from a surface of the fin active region and is extended to an upper surface of the fin active region; the gate insulation layer 112 formed under the gate electrode; and the source/drain region formed in the fin active region of both sides of the gate electrode. An uppermost part of the fin active region is formed higher by about 1000 Å to 1500 Å than an uppermost part of the device isolation film. An upper edge portion of the fin active region is rounding processed. The gate electrode has a depth of about 300 Å to 350 Å from an upper surface of the fin active region, and a bottom face of the gate electrode is rounding processed. The gate electrode has a dual gate structure.

In such a method of forming the fin FET and in such a structure thereof according to an exemplary embodiment of the invention, the fin FET is formed by using a bulk silicon substrate, that is, a recess having a predetermined depth is formed in a fin active region, and then a gate is formed in an upper part of the recess such that a length of top channel formed under the gate is sufficiently guaranteed. Also, lengths of top channel and bottom channel are uniformly formed in the fin active region by increasing a length of the top channel, thus improving swing characteristics of the fin FET. The top channel is formed lower than a source/drain region, thus improving a drain induced barrier lowering (DIBL) and reducing an electric field of channel and source/drain together with enhancing characteristics of the fin FET.

The length increase of top channel can also reduce an impurity ion implantation amount of a threshold voltage control region formed under a gate, thus reducing a junction leakage current of the fin FET and improving refresh characteristics.

Also, when forming the recess having a predetermined depth in the fin active region, a specific etch stop layer is unnecessary, thus simplifying a fabrication process of the fin FET. An upper edge portion of the fin active region is rounding processed, whereby preventing an electric field concentration onto an edge portion and a punch-through of channel, and uniformly forming a gate insulation layer on the fin active region.

As described above, in forming a fin FET by using a bulk silicon substrate, a recess having a predetermined depth is formed in a fin active region and then a gate is formed in an upper part of the recess, thereby sufficiently guaranteeing a length of top channel formed under the gate.

In addition, a length of top channel increases, thereby uniformly forming lengths of top and bottom channels in the fin active region, and improving swing characteristics of the fin FET. The top channel is formed at a position lower than a source/drain region, thus improving a drain induced barrier lowering (DIBL) and reducing an electric field of channel and source/drain, with enhancing characteristics of the fin FET.

A junction leakage current of the fin FET is reduced and a refresh characteristic is enhanced by increasing a top channel length and so by reducing an impurity ion implantation amount of a threshold voltage control region formed under a gate.

In forming a recess having a predetermined depth in a fin active region, a specific etch stop layer is unnecessary, thus simplifying a fabrication process of fin FET. Also, an upper edge portion of the fin active region is rounding processed, whereby preventing an electric field concentration onto an edge portion and a punch-through of channel, and uniformly forming a gate insulation layer on an upper part of the fin active region.

Embodiments of the invention may be practiced in many ways. What follows are exemplary, non-limiting descriptions of some of these embodiments.

An embodiment of the invention provides a method of forming a fin FET by using a bulk silicon substrate. The method includes forming a device isolation film for defining a non-active region and a fin active region in a predetermined region of the substrate; forming a first recess having a predetermined depth from an upper surface of the substrate on a portion of the device isolation film, and a second recess having a depth shallower than the first recess on a portion of the fin active region; forming a gate insulation layer within the second recess; forming a gate in an upper part of the second recess; and forming a source/drain region in the fin active region of both sides of the gate.

Other embodiments of the invention provides a structure of fin field effect transistor (fin FET) formed on a bulk silicon substrate on which an active region and a non-active region are defined by a device isolation film. The structure includes a fin active region having a protrusion shape with step coverage of a predetermined height with the device isolation film, in the device isolation film; a gate electrode, which has a predetermined depth from a surface of the fin active region and is extended to an upper surface of the fin active region; a gate insulation layer formed under the gate electrode; and a source/drain region formed in the fin active region of both sides of the gate electrode.

It will be apparent to those skilled in the art that modifications and variations can be made in the present invention without deviating from the spirit or scope of the invention. For example, a fin FET may be formed by using a substrate and impurities of contrary conductive type and may be provided as a plurality of fin FETs connected to a capacitor, to constitute a memory cell. Thus, it is intended that the present invention cover any such modifications and variations of this invention provided they come within the scope of the appended claims and their equivalents.

The invention claimed is:
1. A semiconductor device comprising:
a substrate including a fin active region;
a device isolation film disposed on the substrate;
a first gate stack disposed on a first portion of the fin active region; and
a source/drain region disposed at a second portion of the fin active region, wherein the device isolation film comprises a first portion located adjacent to the fin active region and below the first gate stack, wherein an upper surface of the first portion of the fin active region located under the first gate stack is higher than an upper surface of the first portion of the device isolation film, wherein the first gate stack covers the upper surface of the first portion of the device isolation film, covers the upper surface of the first portion of the fin active region and extends along two sidewalls of the first portion of the fin active region, and wherein the upper surface of the first portion of the fin active region is lower than an upper surface of the second portion of the fin active region.

2. The semiconductor device of claim 1, wherein the first portion of the device isolation film contacts the fin active region.

3. The semiconductor device of claim 1, wherein, with respect to a vertical cross section taken parallel to a horizontal length direction of the gate stack, the fin active region protrudes from the upper surface of the device isolation film.

4. The semiconductor device of claim 1, further comprising a second gate stack disposed on a third portion of the fin active region.

5. The semiconductor device of claim 4, wherein the second portion of the fin active region is disposed between the first portion of the fin active region and the third portion of the fin active region.

6. The semiconductor device of claim 4, wherein an upper surface of the third portion of the fin active region located under the second gate stack is lower than the upper surface of the second portion of the fin active region.

7. The semiconductor device of claim 1, further comprising a gate insulating layer disposed on the fin active region.

8. The semiconductor device of claim 7, wherein the first gate stack is disposed on the gate insulating layer.

9. The semiconductor device of claim 1, further comprising:

a first spacer disposed on a first sidewall of the first gate stack; and a second spacer disposed on a second sidewall of the first gate stack.

10. The semiconductor device of claim 1, wherein a bottom surface of the first gate stack is lower than an upper surface of the source/drain region.

* * * * *